(12) United States Patent
Umeno

(10) Patent No.: US 9,709,617 B2
(45) Date of Patent: Jul. 18, 2017

(54) LOAD DRIVE APPARATUS

(71) Applicant: DENSO CORPORATION, Kariya, Aichi-pref. (JP)

(72) Inventor: Masafumi Umeno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/973,961

(22) Filed: Dec. 18, 2015

(65) Prior Publication Data

US 2016/0202305 A1 Jul. 14, 2016

(30) Foreign Application Priority Data

Jan. 14, 2015 (JP) .................... 2015-5276

(51) Int. Cl.
*G01R 31/02* (2006.01)
*G01R 31/08* (2006.01)
(Continued)

(52) U.S. Cl.
CPC .......... *G01R 31/025* (2013.01); *G01R 31/02* (2013.01); *G01R 31/024* (2013.01); *H03K 17/0822* (2013.01); *H04B 3/46* (2013.01)

(58) Field of Classification Search
CPC .... G01R 31/00; G01R 31/005; G01R 31/006; G01R 31/02; G01R 31/021; G01R 31/022; G01R 31/024; G01R 31/025; G01R 31/026; G01R 31/083; G01R 31/12; G01R 31/1218; G01R 31/1272; G01R 31/14; G01R 31/2805; G01R 31/2812; G01R 27/02; G01R 27/26; G01R 27/2605; G01R 1/07328; G01N 27/82; G01N 27/90; G01N 27/9046; B60L 3/0069; B60L 3/04; B60L 2240/547; B60L 2270/147; H01B 7/328; H04B 3/46; H03K 17/0822
(Continued)

(56) References Cited

U.S. PATENT DOCUMENTS 3,560,821 A * 2/1971 Beling ............... H02P 8/24
318/400.3
5,936,440 A * 8/1999 Asada .................... H02J 7/245
327/110
(Continued)

FOREIGN PATENT DOCUMENTS

JP 2010-208579 A 9/2010
JP 2013-211711 A 10/2013

*Primary Examiner* — Hoai-An D Nguyen
(74) *Attorney, Agent, or Firm* — Posz Law Group, PLC

(57) ABSTRACT

A load drive apparatus includes a switching element, a current detection circuit, a short circuit detection resistor, and a reflux diode. The switching element is placed to a high side of the inductive load, is interposed between the voltage source and the inductive load, and controls a current supplied to the inductive load. The current detection circuit is placed to a low side of the inductive load, and detects a current value of a current flowing through the low side of the inductive load. The short circuit detection resistor is interposed between the current detection circuit and a ground. The reflux diode is placed in a forward direction of the reflux diode and connects a middle point between the short circuit detection resistor and the current detection circuit with a different middle point between the switching element and the inductive load.

5 Claims, 3 Drawing Sheets

(51) Int. Cl.
*H03K 17/082* (2006.01)
*H04B 3/46* (2015.01)

(58) Field of Classification Search
USPC ....... 324/500, 509, 512, 522, 523, 527, 528, 324/531, 537, 538, 539, 541, 544, 551, 324/555, 557; 702/1, 57, 58, 59
See application file for complete search history.

(56) References Cited

U.S. PATENT DOCUMENTS

| | | | |
|---|---|---|---|
| 7,057,870 B2 * | 6/2006 | Meyer | F02D 41/20 361/139 |
| 2012/0007637 A1 * | 1/2012 | Fukuda | H02M 3/1588 327/110 |
| 2015/0294822 A1 * | 10/2015 | Morimoto | H03K 17/165 361/160 |

* cited by examiner

LOAD DRIVE APPARATUS

CROSS REFERENCE TO RELATED APPLICATION

This application is based on Japanese Patent Application No. 2015-5276 filed on Jan. 14, 2015, the disclosure of which is incorporated herein by reference.

TECHNICAL FIELD

The present disclosure relates to a load drive apparatus that drives an inductive load.

BACKGROUND

Patent literature 1: JP 2010-208579 A

A load drive apparatus detects a current flowing through an inductive load such a linear solenoid by a current detection means, and controls drive of the inductive load while feeding back the amount of current. A failure mode of the load drive apparatus includes a short circuit (also referred to as a power source short circuit) in an upstream side of the inductive load and a short circuit (also referred to as a ground short circuit) in a downstream side of the inductive load. In order to detect these types of short circuits, various methods have been considered.

An electronic control unit in Patent literature 1 detects a ground short circuit by detecting a decrease of a current flowing through a current detection means side. The electronic control unit has, as a resistive element, a diode that is placed in series with the current detection means on a downstream side of a load. According this configuration, it may be possible to prevent a load current that flows through the load from going through the current detection means, and a decrease of current due to ground short circuit may easily be detected.

The inventor of the present disclosure has found the following.

A resistance value of a diode, which is used as a resistance element, is changed based on an I-V characteristic of the diode itself. It may be difficult to adjust the resistance value to a desired resistance value. The resistance value of the diode may be influenced by a noise by manufacture variation and temperature dependence of the I-V characteristics. Thus, variation of the load current due to a short circuit may be buried in the noise, and it may be difficult to obtain sufficient detection accuracy.

SUMMARY

It is an object of the present disclosure to provide a load drive apparatus that enables to detect a ground short circuit more surely.

According to one aspect of the present disclosure, a load drive apparatus that controls drive of an inductive load which a voltage source supplies with voltage is provided. The load drive apparatus includes a switching element, a current detection circuit, a short circuit detection resistor, and a reflux diode. The switching element is placed to a high side of the inductive load, is interposed between the voltage source and the inductive load, and controls a current supplied to the inductive load. The current detection circuit is placed to a low side of the inductive load, and detects a current value of a current flowing through the low side of the inductive load. The short circuit detection resistor is interposed between the current detection circuit and a ground. The reflux diode is placed in a forward direction of the reflux diode and connecting a middle point between the short circuit detection resistor and the current detection circuit with a different middle point between the switching element and the inductive load. The forward direction is a direction from the middle point to the different middle point.

According to the present disclosure, it may be possible to discontinuously change the load current flowing into the current detection circuit when the switching element turn ON and OFF mutually in a case of an occurrence of a short circuit. Since it may be possible to specify the magnitude of the variation by the resistance value of a short circuit detection resistor, it may be possible to detect the variation of the load current due to the short circuit without being buried in the noise. Therefore, it may be possible to detect the short circuit more surely.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
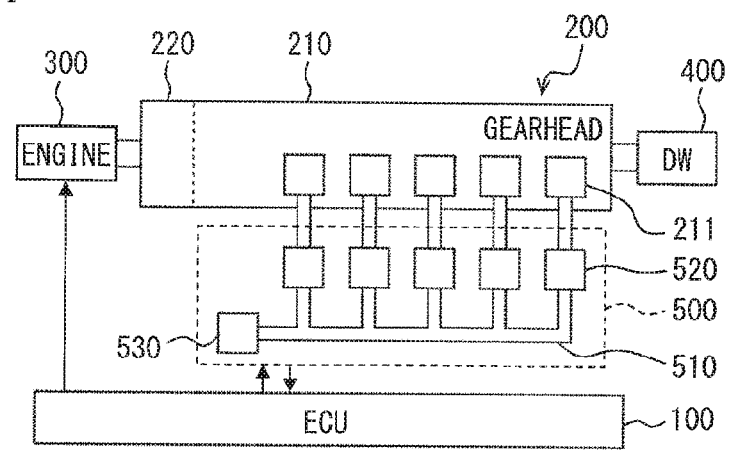
FIG. 1 is a block diagram illustrating a configuration of a load drive apparatus according to a first embodiment and a peripheral device.

Embodiments of the present disclosure will be explained with referring to the drawings. Identical parts or similar parts in each drawing will have the identical symbol.

First Embodiment

With referring to FIG. 1 and FIG. 2, a schematic configuration of a fuel injection control apparatus according to the present disclosure will be explained.

The load drive apparatus in the present embodiment is used in, for example, an automatic transmission, and controls a gear ratio. As described in FIG. 1, a load drive apparatus 100 is communicably connected to a gearhead 200, and automatically controls a gear ratio. Incidentally, the load drive apparatus 100 is written as ECU in FIG. 1. The gearhead 200 mediates an engine 300 and a drive wheel 400, converts torque and rotating speed, and transmits the power of the engine 300 to the drive wheel 400. The gearhead 200 has a gear train 210 and a torque converter 220. The load drive apparatus 100 controls, through hydraulic circuit 500, a combination of multiple gears 211 that configures the gear train 210 to change the gear ratio. Incidentally, the gear 211 is fixed to a shaft (not shown), and a position of the shaft displaces according to supplied oil pressure. According to the displacement of the shaft, a position of the gear 211 displaces. Thus, the gear ratio is controlled by controlling individually the oil pressure supplied to each of the multiple gears 211.

As described in FIG. 1, the hydraulic circuit 500 has an oil passage 510 following the shaft, a hydraulic valve 520 that adjusts the oil pressure provided in the oil passage 510, the oil pressure being supplied to each shaft, and a line pressure valve 530 that adjusts the oil pressure of the oil passage 510 of the upstream from the hydraulic valve 520. Each of the valves 520, 530 has a solenoid 600 as an inductive load. By changing the amount of current supplied to the solenoid 600, a magnetic field is induced around the solenoid 600. The shaft displaces based on the amount of the magnetic field, and a meshing of the gear 211 is changed.

The load drive apparatus 100 according to the present embodiment controls current flowing through the solenoid 600. The load drive apparatus 100 has a switching element 10, a current detection circuit 20, a short circuit detection resistor 30, and a reflux diode 40. The switching element 10 is placed between the solenoid 600 and a voltage source VB supplying a power source voltage. The current detection circuit 20 is placed between a ground GND as a reference potential voltage and the solenoid 600, and detects the current flowing through the solenoid 600. The short circuit detection resistor 30 is placed between the current detection circuit 20 and the ground GND. The reflux diode 40 refluxes the current from a low side of the solenoid 600 to a high side of the solenoid 600. The load drive apparatus 100 further has a controller 50 and a short circuit determination portion 60. The controller 50 performs a pulse width modulation (PWM) control to the switching element 10. The short circuit determination portion 60 outputs a predetermined feedback signal to the controller 50 based on a current value detected by the current detection circuit 20.

The high side of the solenoid 600 represents a voltage source VB side for the solenoid 600. The low side represents a ground GND side to the solenoid 600.

Figure 2:
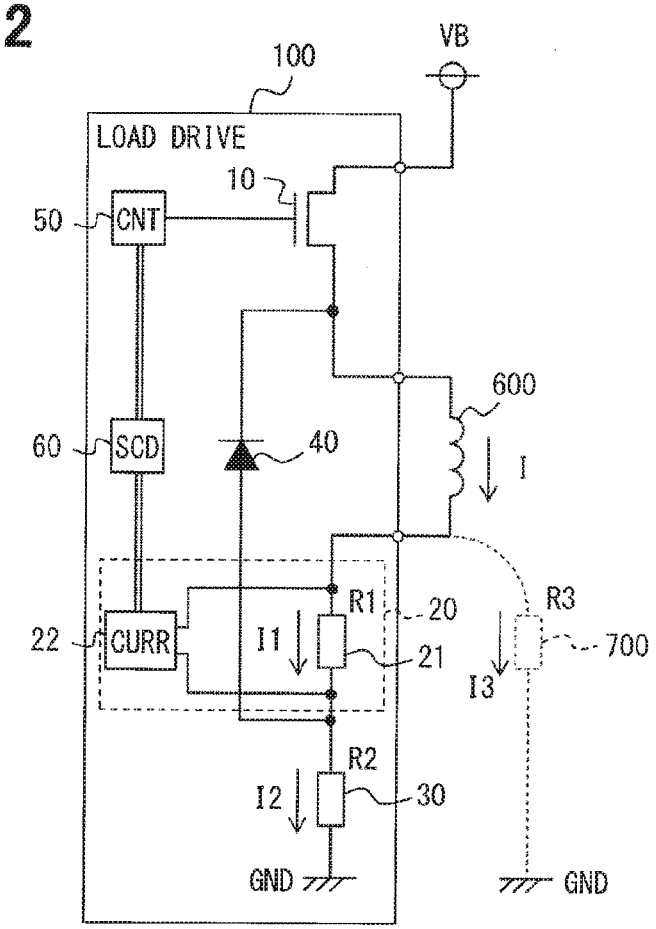
FIG. 2 is a circuit diagram illustrating a detailed configuration of the load drive apparatus.

A resistance component 700, which is illustrated with a broken line in FIG. 2, is a pseudo resistance generated between the solenoid 600 and the ground GND in a case where a short circuit (referred to as a ground short circuit) occurs between the solenoid 600 and the ground GND. The resistance component 700 may be generated with coating of the vehicle, for example. Incidentally, the ground short circuit may also be referred to as a ground fault.

Each component of the load drive apparatus 100 will be explained specifically.

The switching element 10 may be a metal-oxide semiconductor (MOS) transistor in the present embodiment. The switching element 10 receives a pulse width modulation signal (hereinafter, referred to as a PWM signal) from the controller 50 to a gate terminal of the switching element 10, so that a drain current under the PWM control flows through the solenoid 600.

The current detection circuit 20 has a shunt resistor 21 and a current detection portion 22. The current detection portion 22 calculates a current value based Ohm's law from a potential difference of the both ends of the shunt resistor 21 and a resistance value of the shunt resistor 21. The current detection circuit 20 is connected to the low side to the solenoid 600. The load current that flows through the solenoid 600 flows through the grand GND via the current detection circuit 20 and via the shunt resistor 21.

The short circuit detection resistor 30 has a resistance value almost identical with, for example in the present embodiment, the resistance value of the current detection circuit 20. The short circuit detection resistor 30 is placed between the current detection circuit 20 and the ground GND. Thus, a current that flows through the solenoid 600 flows into the solenoid 600 from the voltage source VB via the switching element 10 when no abnormality such as a short circuit occurs, and then, flows through the current detection circuit 20 and the short circuit detection resistor 30 in this order to reach the ground GND.

The reflux diode 40 is placed in a forward direction from a middle point of the current detection circuit 20 and the short circuit resistance 30 toward a middle point between the solenoid 600 and the switching element 10. That is, the forward direction of a diode is a direction from the middle point of the current detection circuit 20 and the short circuit resistance 30 to the middle point between the solenoid 600 and the switching element 10. It is supposed that the reflux diode 40 is not placed. In this case, when the switching element 10 turns into OFF from ON, potential of the high side of the solenoid 600 may be excessively decreased by self-induction of the solenoid 600, and an unintended voltage may be applied to the both ends of the switching element 10. The reflux diode 40 prevents this situation from occurring, and the reflux diode 40 supplies current from the ground GND to the high side of the solenoid 600 at the time of turning OFF of the switching element 10.

The controller 50 outputs to a control terminal of the switching element 10, the PWM signal that controls to turn ON and OFF of the switching element 10. The controller 50 adjusts an output current of the switching element 10 by controlling a duty ratio of the PWM signal, and controls the load current flowing through the solenoid 600.

The short circuit determination portion 60 is connected to the controller 50 and the current detection circuit 20, especially the current detection portion 22. The short circuit determination portion 60 feeds back the load current that is calculated by the current detection portion 22 to the controller 50. The controller 50 controls turning ON and OFF of the switching element 10 and controls the duty ratio of the PWM control based on information relating with the load current, which is input from the short circuit determination portion 60.

Figure 3:
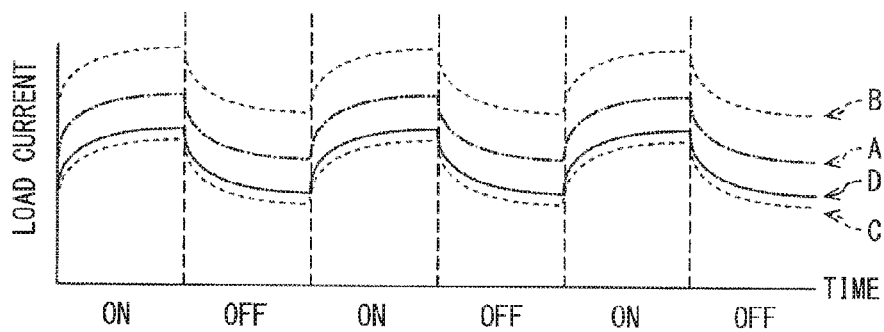
FIG. 3 is a diagram illustrating behavior of a load current in a comparative example.
Figure 4:
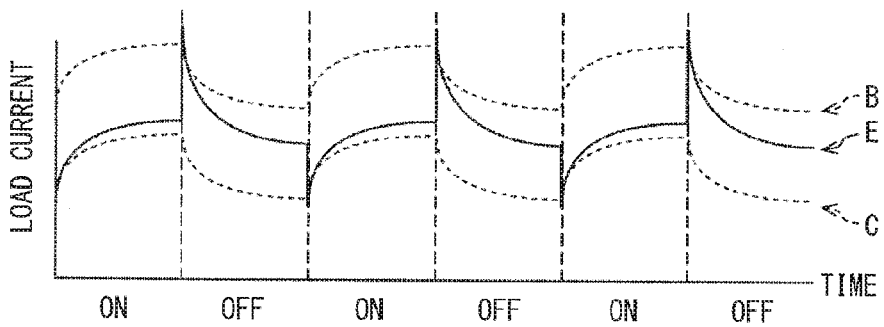
FIG. 4 is a diagram illustrating behavior of a load current in the load drive apparatus according to the first embodiment.

Behavior of the load current detected by the current detection circuit 20 will be explained with referring to FIG. 3 and FIG. 4. In FIG. 3 and FIG. 4, the abscissa represents time, and the ordinate represents a current value of the load current that flows through the current detection circuit 20.

In order to clarify a difference between a configuration of a comparative example and a configuration of the present embodiment, behavior of the load current in the comparative example will be explained. The comparative example does not include the short circuit detection resistor 30, which is illustrated in FIG. 2.

In FIG. 3, a waveform that is illustrated with a dashed dotted line represents behavior of the load current when the short circuit does not occur. When the switching element 10 receives the PWM signal and the switching element 10 is in an ON state, the load current increases based on inductance of the solenoid 600. When to supply the switching element 10 with gate voltage is stopped, the switching element 10 turns OFF, so that energy in the solenoid 600 is released and the load current decreases.

A waveform B that is illustrated with a broken line represents a predetermined upper limit threshold that is set to detect an abnormality of the solenoid 600 including a short circuit. A waveform C that is illustrated with a broken line represents a predetermined lower limit threshold. These thresholds (the upper limit threshold and the lower limit threshold) are set in consideration of variations such as an inductance of a load, voltage of the voltage source VB, and the characteristics of the switching element 10. The short circuit determination portion 60 determines that abnormality occurs in the solenoid 600 and notifies the controller 50 of the abnormality, when the detected load current exceeds the upper limit threshold or goes below the lower limit threshold.

A waveform D that is illustrated with a continuous line represents behavior of the load current in a case where a half short circuit which at least has resistance component 700 between the solenoid 600 and the ground GND occurs. The current flowing through the solenoid 600 is divided into current that flows into the ground GND via the current detection circuit 20 and current that flows into the ground GND via the resistance component 700. Thus, the load current detected by the current detection circuit 20 has offset to a lower current value than the waveform A as illustrated in FIG. 3.

It is supposed that the resistance value of the resistance component 700 is sufficiently smaller than the resistance value of the shunt resistor configuring the current detection circuit 20. In this case, most of the current flowing through the solenoid 600 flows into a current pathway generated by the short circuit, so that the amount of the offset increases. The load current goes below the lower limit threshold, so that it may be possible for the short circuit determination portion 60 to determine the short circuit of the solenoid 600. When the resistance value of the resistance component 700 is almost equal to the resistance value of the shunt resistor configuring the current detection circuit 20, the amount of the offset that goes below the lower limit threshold may not be assured. Thus, according to the resistance value of the resistance component 700, the short circuit may be not detected even when the short circuit in the solenoid 600 occurs.

By contrast, according the load drive apparatus 100 in the present embodiment, the load current at the time of occurrence of the half short circuit is illustrated as a waveform E, which is illustrated with a solid line in FIG. 4. The load current is discontinuous at the time when the switching element 10 switches between ON and OFF. At a time point before and after the discontinuous point, the load current changes according to the amount of the resistance value of the short circuit detection resistor 30. Therefore, by setting the resistance value of the short circuit detection resistor 30, the load current exceeds the upper limit threshold or goes below the lower limit threshold. It may be possible to detect the ground short circuit surely.

A current I that flows through the solenoid 600, a current (corresponding to the load current) I1 that flows through the current detection circuit 20, a current I2 that flows through the short circuit detection resistor 30, and a current I3 that flows through the resistance component 700 are defined as illustrated in FIG. 2. Regarding the currents I, I1, I2, I3, positive directions are defined from the high side to the low side. A resistance value R1 of the shunt resistor configuring the current detection circuit 20, a resistance value R2 of the short circuit detection resistor 30, and a resistance value R3 of the resistance component 700 are defined.

The load current I1 is calculated based on Kirchhoff's law. When the switching element 10 is in an ON state, that is, when the switching element 10 receives the PWM signal, the following expression is satisfied:

$$I1 = R3 \times I/(R1+R2+R3).$$

When the switching element 10 is in an OFF state, the following expression is satisfied:

$$I1 = (R2+R3) \times I/(R1+R2+R3).$$

That is, when the switching element 10 switches over between turning ON and OFF, the load current I1 is discontinuous. Quantitatively, when the switching element 10 changes from the ON state to the OFF state, the load current I1 becomes (R2+R3)/R3 times. When the switching element 10 changes from the OFF state to the ON state, the load current I1 becomes R3/(R2+R3) times. Incidentally, according to the configuration of the comparative example, a situation corresponds to a case where R2 is equal to zero, and the waveform D illustrated in FIG. 3 is continuous.

Although the resistance value R3 of the resistance component 700 may change according to a situation of a short circuit, the resistance value R2 of the short circuit detection resistor 30 is arbitrarily set by a designer. For example, by setting the resistance value R2 into a value equal to the resistance value R3 of the resistance component 700 or more, it may be possible that the load current exceeds the upper limit threshold or goes below the lower limit threshold.

Second Embodiment

In the first embodiment, as a condition determining that the solenoid 600 is short circuited, the load current is compared with the upper limit threshold or the lower limit threshold. A different reference or a different condition may be used. The load drive apparatus 100 in a second embodiment determines that the solenoid 600 is short circuited according to a condition that a difference between a maximal value and a minimal value of the current value in the load current exceeds a predetermined first threshold in a cycle including at least one turning ON and OFF of the current supply to the solenoid 600. Incidentally, a configuration of a circuit is similar to the configuration of the first embodiment illustrated in FIG. 2, and a detailed explanation will be omitted.

Figure 5:
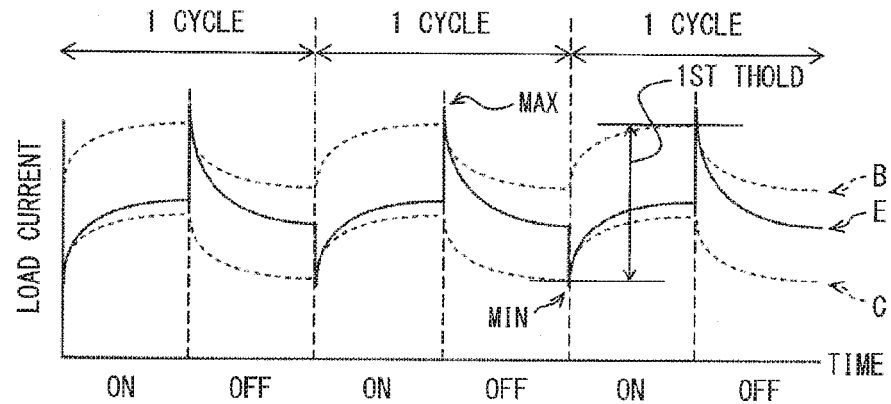
FIG. 5 is a diagram illustrating a determination method executed by a short circuit determination portion according to a second embodiment.

In one cycle of the switching element 10 that periodically turns ON and OFF, as illustrated in FIG. 5, at least one time of turning ON and OFF of the current supply to the solenoid 600 is included. The short circuit determination portion 60 acquires the maximal value and the minimal value of the current value of the load current in the one cycle, and calculates the difference. The first threshold may be set arbitrarily. For example, in the present embodiment, the first threshold is a difference between a maximal value of the upper limit threshold and a minimal value of the lower limit threshold, which are explained in the first embodiment. The short circuit determination portion 60 determines that the solenoid 600 is short circuited when the difference between the maximal value and the minimal value of the load current exceeds the first threshold.

Third Embodiment

As another condition determining that the solenoid 600 is short circuited, it may be determined whether an absolute value of temporal differentiation of the current value of the load current exceeds a second threshold.

Figure 6:
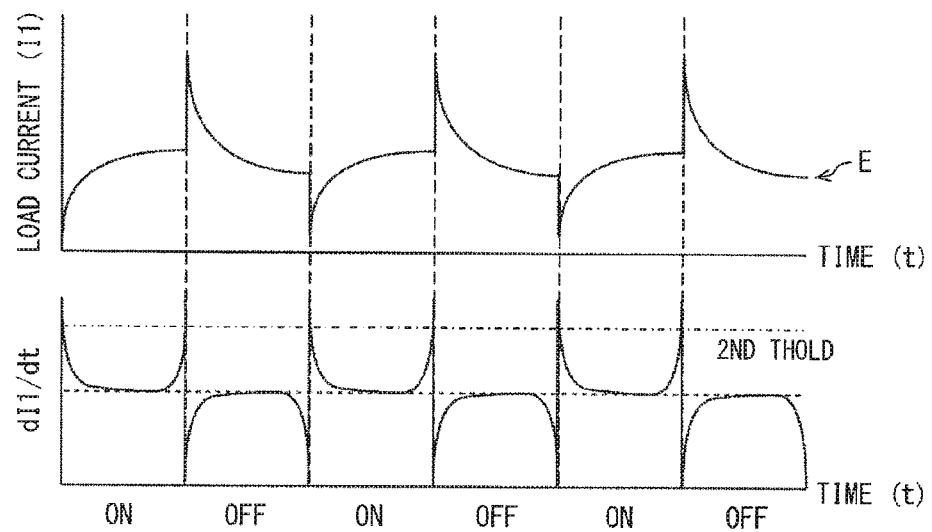
FIG. 6 is a diagram illustrating a determination method executed by a short circuit determination portion according to a third embodiment.

As explained in the first embodiment, the load drive apparatus 100 according to the present embodiment has the short circuit detection resistor 30. Accordingly, when the switching element 10 switches over from the ON state to the OFF state, or from the OFF state to the ON state, the load current is discontinuous. More precisely, a detected current value of the load current rapidly changes to time. Therefore, as illustrated in FIG. 6, the absolute value of time differentiation of the load current has a greater value than that of the comparative example.

The short circuit determination portion 60 in the third embodiment compares the absolute value of the time differentiation of the load current with the second threshold, which is set arbitrarily. When the absolute value of the time differentiation of the load drive exceeds the second threshold, it is determined that the solenoid 600 is short circuited.

According to this configuration, instead of an absolute value of the load current, a point where the current value of the load current rapidly changes as compared with the comparative example is used for determination. It may be possible to remove a noise that does not change rapidly temporally, such as a variation of voltage of the voltage source VB, a temperature characteristic of the switching element 10, and to detect the short circuit of the solenoid 600.

A specific method for calculating time differential value of the load current will be explained with referring to FIG. 7.

Figure 7:
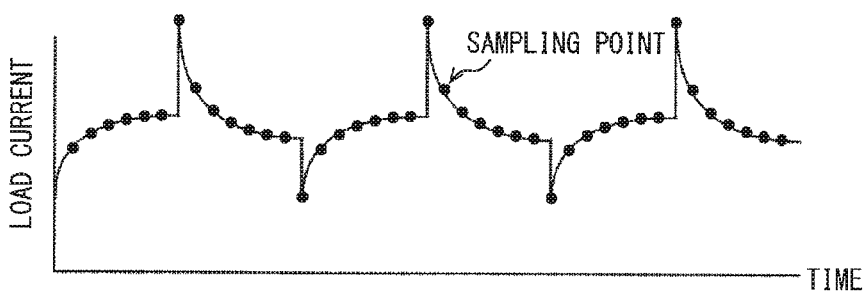
FIG. 7 is a diagram illustrating a sampling point of the load current.

The short circuit determination portion 60 samples the load current at equal time intervals all the time, as illustrated in a filled point of FIG. 7. Regarding discrete values of the sampled load current, the short circuit determination portion 60 calculates a difference of the load currents of sampling points that are temporally adjacent to each other. The difference value corresponds to a variation of the load current per unit time. Thus, the difference value artificially represents a differential value of the load current. It may be possible for the short circuit determination portion 60 to calculate the differential value of the load current.

Incidentally, when the difference of the load current is calculated, it is not limited to calculate the difference of the load current of sampling points that are temporally adjacent to each other. For example, the differential value of the load current may be a difference between a sampling point after a certain time and a sampling point before the certain time. That is, regarding the load current acquired discretely, as long as a physical quantity corresponding to variation of the load current per unit time is calculated, any kind of calculation method may be used.

Modified Embodiment

Regarding acquisition of the sampling point, the short circuit determination portion 60 in the third embodiment samples the load current at equal time intervals all the time. The sampling point may be acquired selectively in a part of the whole time.

The controller 50 controls the switching element 10 to be turned ON and OFF. The short circuit determination portion 60 may determine time of sampling of the load current based on a control signal that determines turning ON and OFF of the PWM signal of the controller 50. Specifically, the short circuit determination portion 60 may acquire a sampling point when the switching element 10 switches over from the ON state to the OFF state, and other sampling points before and after the sampling point of the switchover. Alternatively, the short circuit determination portion 60 may acquire a sampling point when the switching element 10 switches over from the OFF state to the ON state, and other sampling points before and after the sampling point of the switchover.

Accordingly, it may be possible to acquire only sampling points when the current value of the load current may rapidly change at a time of the ground short circuit of the solenoid 600. It may be possible to improve robustness to an external noise. Since a sampling operation stops in a period of time when the current value does not rapidly change, it may be possible to reduce processing load on the short circuit determination portion 60.

Other Embodiments

As described above, embodiments of the present disclosure is described, the present disclosure is not limited to the above described embodiment, and the present disclosure may be performed in various modified manner within a scope of the present disclosure.

In the above embodiments and modified embodiment, the inductive load corresponds to the solenoid 600 that is used in the automatic transmission. However, the application of the present disclosure is not limited the present embodiments and modified embodiment. The present disclosure can be applied to the solenoid of the automatic transmission. In addition, the present disclosure can be applied to a drive apparatus of an inductive load such as a solenoid provided to an electromagnetic valve of an injector.

In the embodiments and the modified embodiment, the switching element 10 turns ON and OFF periodically. It may be unnecessary to operate periodically since discontinuity of the load current is generated as long as a switchover from the ON state to the OFF state or a switchover from the OFF state to the ON state is included. The switching element 10 is not limited to the MOS transistor. The switching element 10 may be a bipolar transistor, or an insulated gate bipolar transistor.

In the embodiments and the modified embodiment, the current detection circuit 20 is provided by a circuit detecting the load current from potential difference of the both ends of the shunt resistor. As long as the load current is detected, a circuit configuration of the current detection circuit 20 is not limited.

In the embodiments and the modified embodiment, the short circuit detection resistor 30 is provided by a resistor having a constant resistance value of R2. Any element whose resistance value is variable arbitrarily such as a variable resistor, a metal-oxide semiconductor (MOS) transistor may be used as the short circuit detection resistor 30. Since a designer arbitrarily changes the resistance value R2 after mounting of the element, for example, it may be possible to select a resistance value suitable for a system in which a load drive apparatus according to the present disclosure is applied.

While the embodiments, the configurations, the aspects of the load control apparatus have been described by way of example, it should be appreciated that embodiments, configurations, aspects of the present disclosure are not limited to the respective embodiments, the respective configurations, and the respective aspects described above. For example, embodiments, configurations, aspects obtained by appropriately combining technical portions disclosed in different embodiments, configurations, and aspects are included within a range of embodiments, configurations, and aspects of the present disclosure.

What is claimed is:
1. A load drive apparatus that controls drive of an inductive load which a voltage source supplies with voltage, the load drive apparatus comprising:
a switching element that is placed to a high side of the inductive load, is interposed between the voltage source and the inductive load, and controls a current supplied to the inductive load;

a current detection circuit that is placed to a low side of the inductive load, and detects a current value of a current flowing through the low side of the inductive load;

a short circuit detection resistor that is interposed between the current detection circuit and a ground and is connected in series with the current detection circuit;

a reflux diode that is placed in a forward direction of the reflux diode and connects a middle point between the short circuit detection resistor and the current detection circuit with a different middle point between the switching element and the inductive load, wherein the forward direction is a direction from the middle point to the different middle point; and a short circuit determination portion that determines a half short circuit based on a load current that flows through the current detection circuit.

2. The load drive apparatus according to claim 1, wherein:

the short circuit determination portion is configured to determine that the inductive load is short circuited when a current value of the load current exceeds a predetermined upper limit threshold, or when the current value of the load current goes below a predetermined lower limit threshold.

3. The load drive apparatus according to claim 1, wherein:

the short circuit determination portion is configured to determine that the inductive load is short circuited when, in a cycle including at least one turning ON and at least one turning OFF of current supply to the inductive load, a difference between a maximal value and a minimal value of a current value of the load current exceeds a predetermined first threshold.

4. The load drive apparatus according to claim 1, wherein:

the short circuit determination portion is configured to determine that the inductive load is short circuited when an absolute value of a time differentiation of the load current exceeds a predetermined second threshold.

5. The load drive apparatus according to claim 4, wherein:

the short circuit determination portion is configured to acquire a current value of the load current at a time of switching ON and OFF of current supply to the inductive load; and the short circuit determination portion is configured to calculate a time differentiation value of the acquired load current.

\* \* \* \* \*